(12) United States Patent
Shrivastava et al.

(10) Patent No.: US 8,629,420 B1
(45) Date of Patent: Jan. 14, 2014

(54) DRAIN EXTENDED MOS DEVICE FOR BULK FINFET TECHNOLOGY

(75) Inventors: Mayank Shrivastava, Unterhaching (DE); Harald Gossner, Riemerling (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/540,762

(22) Filed: Jul. 3, 2012

(51) Int. Cl.
*H01L 45/00* (2006.01)

(52) U.S. Cl.
USPC .............. 257/4; 257/365; 257/347; 257/330; 257/E21.09; 257/401

(58) Field of Classification Search
USPC ............................ 257/24, 365, 401, 330, 347
See application file for complete search history.

(56) References Cited

U.S. PATENT DOCUMENTS

| | | | |
|---|---|---|---|
| 2008/0029821 A1* | 2/2008 | Yamagami et al. ........... | 257/365 |
| 2008/0061370 A1* | 3/2008 | Matsuo ......................... | 257/347 |
| 2010/0144121 A1* | 6/2010 | Chang et al. .................. | 438/478 |
| 2010/0202184 A1* | 8/2010 | Lee ................................ | 365/96 |
| 2012/0306005 A1* | 12/2012 | Satoh et al. .................... | 257/330 |
| 2012/0319211 A1* | 12/2012 | van Dal et al. ................ | 257/401 |
| 2013/0032783 A1* | 2/2013 | Pillarisetty et al. ............ | 257/24 |
| 2013/0102130 A1* | 4/2013 | Cheng et al. .................. | 438/478 |
| 2013/0148409 A1* | 6/2013 | Chung .......................... | 365/148 |
| 2013/0183804 A1* | 7/2013 | Wang et al. ................... | 438/285 |

* cited by examiner

*Primary Examiner* — Mamadou Diallo
(74) *Attorney, Agent, or Firm* — Eschweiler & Associates, LLC

(57) ABSTRACT

Some aspects relate to a FinFET that includes a semiconductor fin disposed over a semiconductor substrate and extending laterally between a source region and a drain region. A shallow trench isolation (STI) region laterally surrounds a lower portion of the semiconductor fin, and an upper portion of the semiconductor fin remains above the STI region. A gate electrode traverses over the semiconductor fin to define a channel region in the semiconductor fin under the conductive gate electrode. A punch-through blocking region can extend between the source region and the channel region in the lower portion of the semiconductor fin. A drain extension region can extend between the drain region and the channel region in the lower portion of the semiconductor fin. Other devices and methods are also disclosed.

19 Claims, 11 Drawing Sheets

100

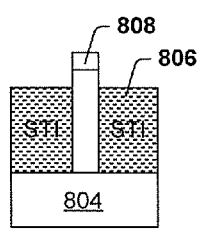 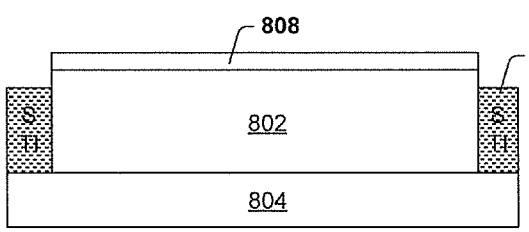 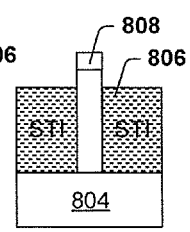
Fig. 8A  Fig. 8B  Fig. 8C
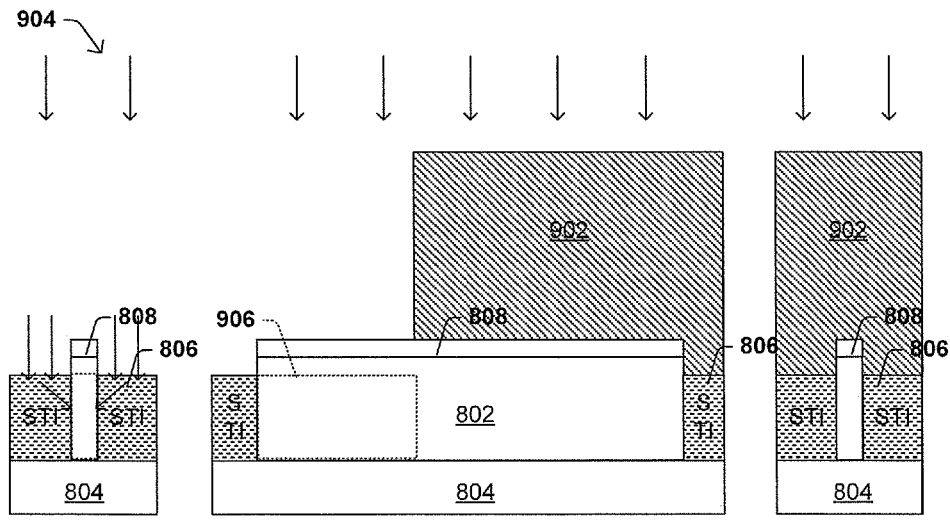
Fig. 9A  Fig. 9B  Fig. 9C

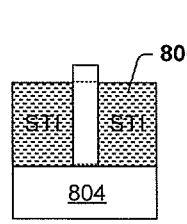 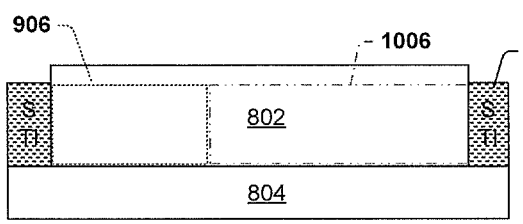 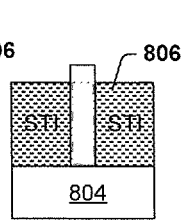
Fig. 12A          Fig. 12B          Fig. 12C
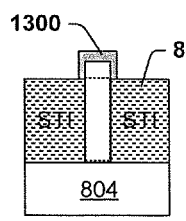 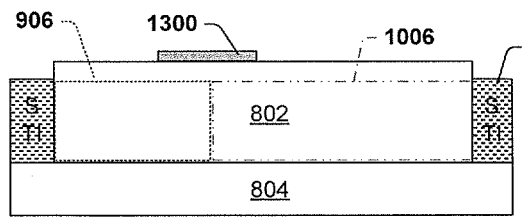 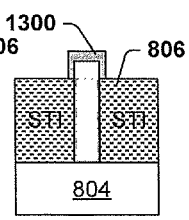
Fig. 13A          Fig. 13B          Fig. 13C

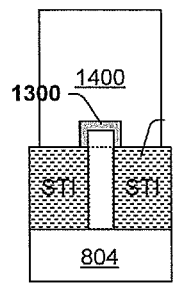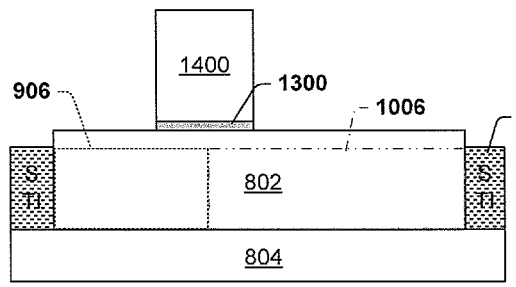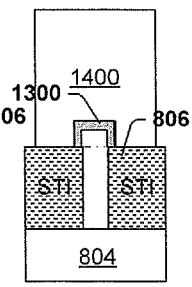
Fig. 14A            Fig. 14B            Fig. 14C
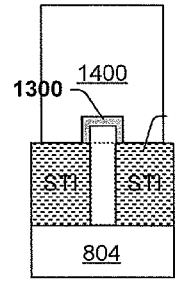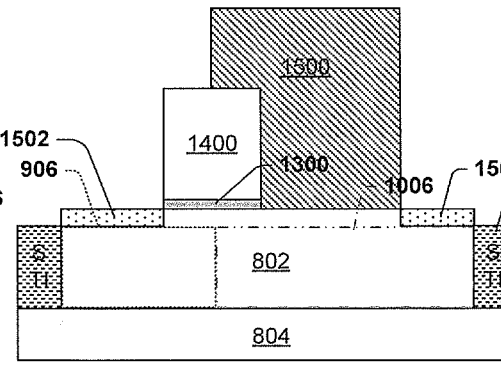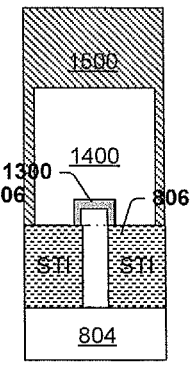
Fig. 15A            Fig. 15B            Fig. 15C

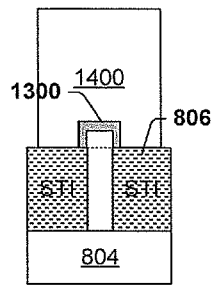 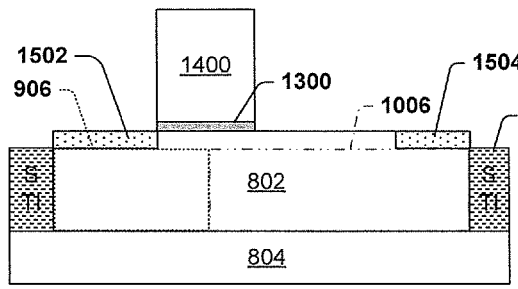 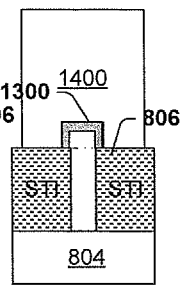
Fig. 16A    Fig. 16B    Fig. 16C
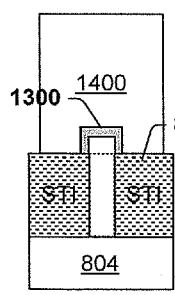 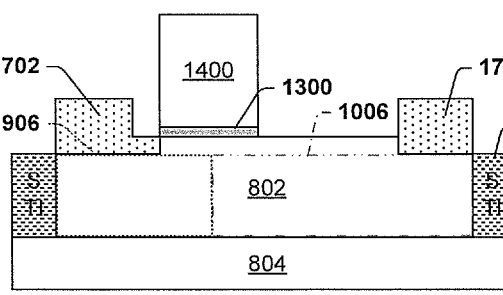 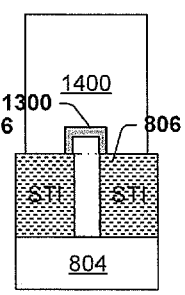
Fig. 17A    Fig. 17B    Fig. 17C

DRAIN EXTENDED MOS DEVICE FOR BULK FINFET TECHNOLOGY

BACKGROUND

A conventional planar complementary metal oxide semiconductor (CMOS) transistor has four parts: a source, a drain, a channel disposed between the source and drain, and a gate disposed over the channel to control the channel. In planar CMOS transistors, the source, drain, and channel are formed by implanting ions into a planar semiconductor substrate, and the gate is then formed over a surface of the semiconductor substrate so as to overlie the channel. Engineers continuously seek to shrink the size of such transistors over successive generations of technology to "pack" more transistors into a given unit area, which provides consumers with devices that exhibit improved functionality.

One of the more recent advances in this continuing effort to shrink the size of CMOS transistors is the advent of fin field effect transistors (FinFETs). Unlike planar CMOS transistors where the source, drain, and channel are formed in a planar substrate; in FinFETs the source, drain, and channel region are formed in a thin slice of semiconductor material (i.e., a "fin"), which extends upward from the semiconductor substrate. A gate is then formed over the channel region in the fin. During operation, the gate is turned on to put the channel in a highly conductive state that allows electrons or holes to easily move from source to the drain. Conversely, when the gate is switched off, this conductive path in the channel region is supposed to disappear. Although this basic functionality is well established, unfortunately, it has been difficult to efficiently manufacture FinFETs that reliably withstand large voltages for high voltage and input/output circuit operations. Therefore, the present disclosure provides improved techniques for high-voltage FinFETs.

BRIEF DESCRIPTION OF THE DRAWINGS

FIGS. 8-17 show a series of cross-sectional views that collectively depict a manufacturing method in accordance with one aspect of present disclosure.

DETAILED DESCRIPTION

Figure 1:
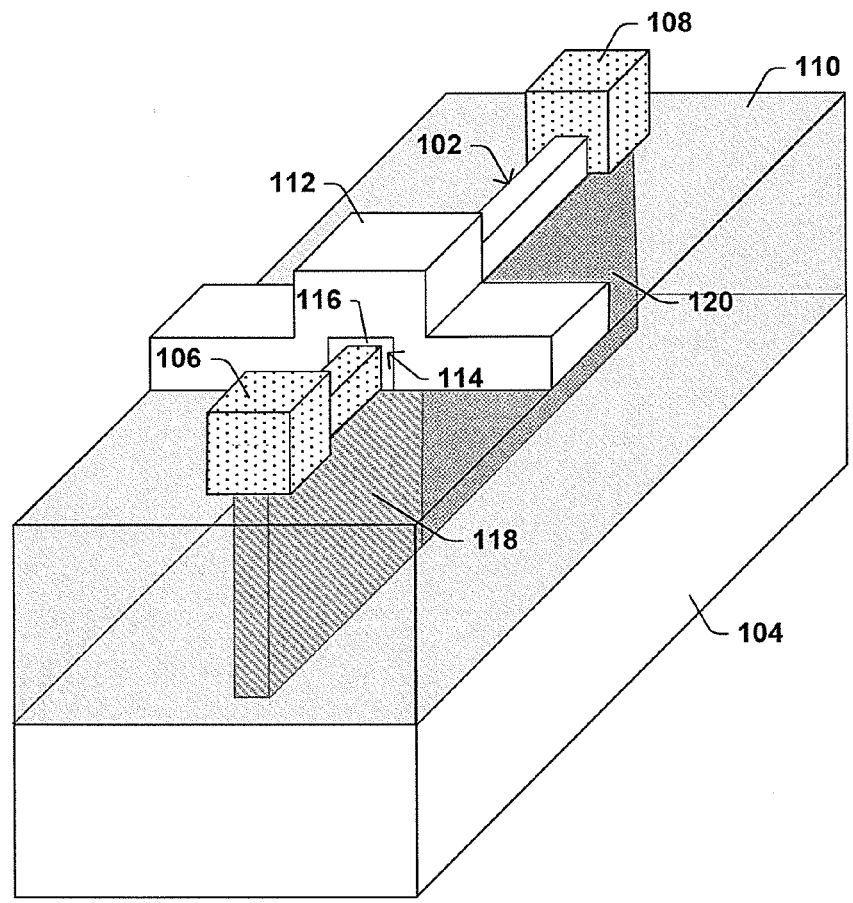
FIG. 1 shows a perspective view of a FinFET in accordance with one aspect of the present disclosure.
Figure 2A:
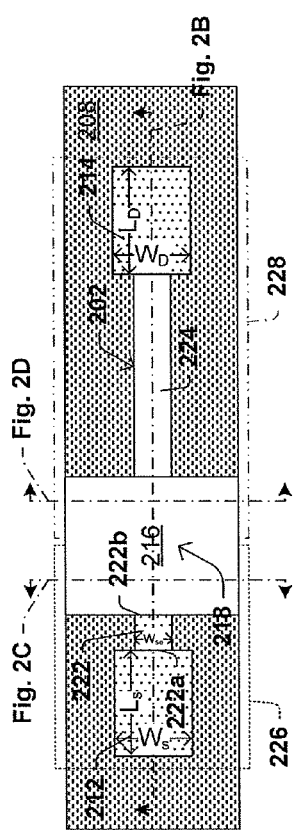
FIG. 2A shows a top view of FIG. 1's FinFET.
Figure 2D:
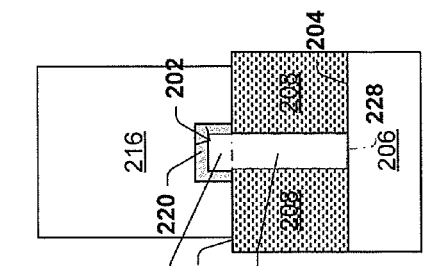
FIG. 2D shows a cross-sectional view of FIG. 2A's FinFET, as taken along a second transverse cut.
Figure 2B:
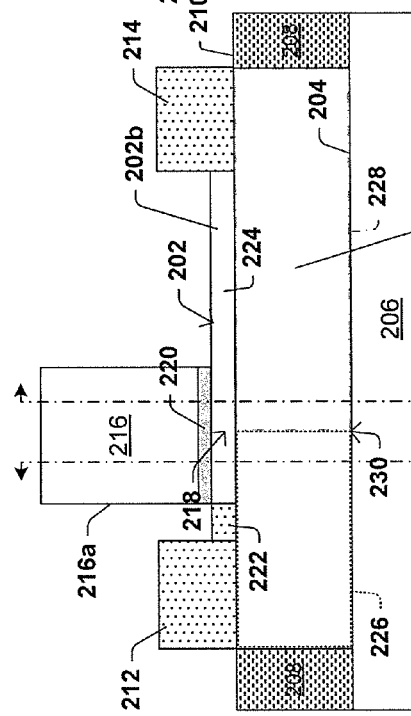
FIG. 2B shows a cross-sectional view of FIG. 2A's FinFET in the longitudinal direction.
Figure 2C:
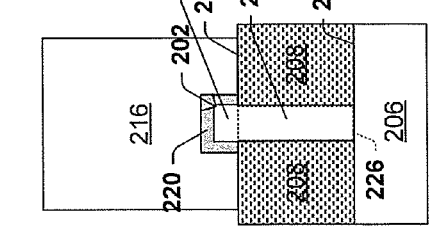
FIG. 2C shows a cross-sectional view of FIG. 2A's FinFET, as taken along a first transverse cut.

The present disclosure will now be described with reference to the attached drawing figures, wherein like reference numerals are used to refer to like elements throughout, and wherein the illustrated structures and devices are not necessarily drawn to scale. Further, to the extent that some illustrated aspects may be described with reference to a Fin field effect transistor (FinFET), it will be appreciated that the term FinFET includes, but is not limited to: tri-gate transistors, omega transistors, multi-gate transistors (MUGFETs) and the like, all of which are contemplated as falling within the scope of the present disclosure.

Whereas conventional techniques have struggled with how to efficiently manufacture FinFETs to reliably withstand large voltages, the present disclosure relates to improved techniques for drain extended high voltage FinFETs. In particular, some aspects of the present disclosure form a drain extension region in a lower portion of a semiconductor fin between a gate electrode and a drain region of a high-voltage FinFET. To streamline manufacture of this high voltage (e.g., drain extended) FinFET and ensure it integrates well with low-voltage FinFETs, the drain extension region can be formed by using a punch-through implant used to concurrently form low-voltage FINFETs. Thus, this punch-through implant forms a punch-through blocking region for the low-voltage FinFETs. Consequently, the present disclosure reuses an existing implant (e.g., a punch-through implant) for a new configuration that improves manufacturing efficiency.

FIG. 1 shows a FinFET 100 in accordance with some aspects. The FinFET 100 includes a semiconductor fin 102 extending upwardly from semiconductor substrate 104. The fin 102 extends laterally between a source region 106 and a drain region 108. A shallow trench isolation (STI) region 110 laterally surrounds the semiconductor fin 102. A conductive gate electrode 112 traverses over the semiconductor fin 102 to define a channel region 114 in the semiconductor fin under the conductive gate electrode 112. A gate dielectric 116 separates the conductive gate electrode 112 from the channel region 114. A punch-through blocking region 118 is arranged in the semiconductor fin 102 between the source region 106 and the channel region 114. A drain extension region 120, is arranged in the semiconductor fin 102 between the channel region 114 and the drain region 108. As will be appreciated in greater detail below, the punch-through blocking region 118 helps to limit punch-through and correspondingly limit leakage current, while the drain extension region 120 helps to dissipate large voltages over its bulk and correspondingly protects the FinFET from high-voltage pulses. In this way, the disclosed FinFET techniques provide a good balance between limited power consumption (e.g., due to the punch-through blocking region 118) and reliable high-voltage operation (e.g., due to the drain extension region).

During operation, a voltage bias is applied between the conductive gate electrode 112 and source 106 (so called VGS bias). When VGS is greater than a threshold voltage (VT) of the FinFET 100, the channel region 114 is put in a highly conductive state that allows electrons or holes to easily move from source 106 to drain 108 in the presence of a voltage between source and drain (VDS). Conversely, when VGS is less than VT, the channel region 114 is in a high impedance state so little or no carriers flow between source 106 and drain 108. Notably, even when the channel region 114 is in the high impedance state, but for the punch-through blocking region 118, excess carriers could "leak" from source 106 to drain 108—particularly deeper in the fin 102 beneath the channel region 114 where the gate electrode 112 is less able to control the potential applied. Because the punch-through blocking region 118 has a conductivity type that is opposite that of the source 106, the punch-through blocking region 118 acts as an energetic barrier with regards to carriers from the source 106 and prevents current from being leaked deeper into the fin 102 or substrate 104, thereby helping to limit punch-through.

Further, because the drain extension region 120 has the same conductivity type as the drain 108 and is electrically coupled to the drain 108, the drain extension region 120 represents a lower energetic barrier for carriers in the channel 114 and acts as a drain-extension region, which acts as a resistor to dissipate large voltages between source 106 and drain 108 such that the FinFET 100 can safely withstand higher voltages.

In one example, the integrated circuit on which the FinFET is formed includes one or more high-voltage FinFETs as shown in FIG. 1, as well as one or more low-voltage FinFETs. These low-voltage FinFETS include a punch-through blocking region in a lower fin region between source and drain (e.g., somewhat akin to the punch-through blocking region shown in FIG. 1), but do not include a drain extension region. To save a mask step and an implantation step, the drain extension regions of the high-voltage FinFETs having a first conductivity type are implanted concurrently with the punch-through blocking regions of the low-voltage FinFETs having a second conductivity type. For example, a n-type drain extension region for an n-type drain extension FinFET can be implanted simultaneously with a n-type punch-through blocking region for a p-type low-voltage FinFET while a single mask remains in place. This configuration can thereby provide advantageous drain-extended FinFETS and at the same time do so in an efficient manner.

FIG. 2A and FIGS. 2B-2D, which are now referred to collectively, show a top view and cross-sectional views, respectively of FinFET 200. FinFET 200 includes a semiconductor fin 202 extending upwardly from an upper surface 204 of semiconductor substrate 206. Shallow trench isolation (STI) region 208, which is made of a dielectric material (e.g., silicon dioxide), has an upper surface 210 that divides the semiconductor fin 202 into a lower portion 202a and an upper portion 202b. The STI region 208 laterally surrounds the lower fin portion 202a, while the upper fin portion 202b remains above the upper surface 210 of STI region 208.

A source region 212 and a drain region 214 are disposed in or adjacent to the upper fin portion 202b. The source region 212 and drain region 214 have a first conductivity type (e.g., n-type) at a first doping concentration (e.g., ranging from about $1e21$ $cm^{-3}$ to about $1e22$ $cm^{-3}$). Although the lengths of the source and drain LS, LD are shown as being equal, they can also be different. The same is also true of the source and drain widths Ws, WD.

A conductive gate electrode 216 traverses over fin 202 between source region 212 and drain region 214. The conductive gate electrode 216 is typically made of metal, but could also be made out of polysilicon. A channel region 218 is defined in the semiconductor fin 202 under the conductive gate electrode 216. A gate dielectric 220 separates the conductive gate electrode 216 from the channel region 218.

A source extension region 222, which can have a smaller width WSE than that of the source 212 in some implementations, has one end 222a that is electrically coupled to the source 212 and another end 222b that can be aligned with a front edge 216a of the gate. The source extension region 222 has the first conductivity type (e.g., n-type) at a first doping concentration (e.g., ranging from about $1e21$ $cm^{-3}$ to about $1e22$ $cm^{-3}$).

An intrinsic, un-doped or lightly doped semiconductor region 224 can extend continuously from the gate front edge 216a to the drain 214. This intrinsic or lightly doped semiconductor region can be made of silicon or another semiconductor material other than silicon, such as gallium arsenide for example. In one example, this region 224 can be made of silicon with the first conductivity type at a doping concentration ranging from about $1e10$ $cm^{-3}$ to about $1e18$ $cm^{-3}$. Note that although the illustrated embodiments depict one edge of the intrinsic or lightly doped semiconductor region 224 terminating under an edge of the gate electrode, the intrinsic or lightly doped semiconductor region 224 can also extend continuously between the source and drain regions.

Below the upper surface of the STI region 210, a punch-through blocking region 226 is arranged in the lower portion 202a of the semiconductor fin between the channel region 218 and the source region 212. The punch-through blocking region 226 has the first conductivity type (e.g., n-type) and can be at a doping concentration ranging from approximately $1e16$ $cm^{-3}$ to approximately $1e19$ $cm^{-3}$.

A drain extension region 228 extends between the drain region 214 and the channel region 218. The drain extension region 228 has a second conductivity type (e.g., p-type), which is opposite the first conductivity type, and can be at a doping concentration ranging from approximately $1e16$ $cm^{-3}$ to about $1e19$ $cm^{-3}$.

The punch-through blocking region 226 and drain extension region 228 often meet to form a p-n junction 230 under the gate electrode 216. For example, in FIG. 2 this p-n junction 230 is approximately mid-way under the gate 216, however, it could also be closer to one gate edge rather than the other gate edge or could be outside of the gate edges. Further, rather than meeting at a p-n junction as illustrated, in other un-illustrated implementations the punch-through blocking region 226 and drain extension region 228 are separated by a region of intrinsic semiconductor material under the gate electrode 216. Whether a p-n junction is present (or whether intrinsic silicon under the gate separates the punch-through blocking region from the drain extension region) depends on the VT desired for the FinFET 200.

Figure 3A:
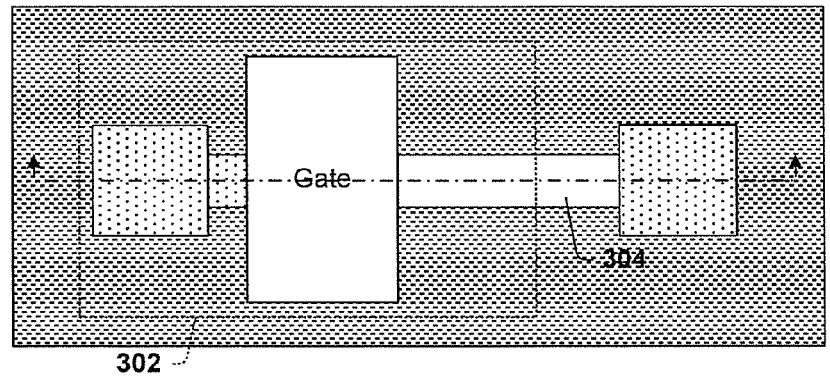
FIGS. 3A-3B show top and side views of a FinFET where only a first punch-through blocking region is used.
Figure 3B:
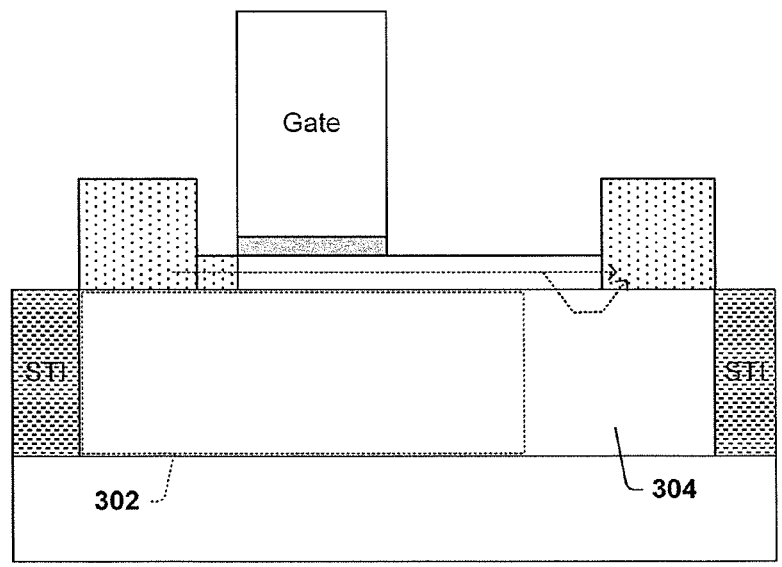

Although FIGS. 2A-2D show an example that includes a punch-through blocking region as well as a drain extension region, other implementations can omit either of these regions. Thus, FIG. 3A-3B show a top view and cross-sectional view, respectively, that illustrate a FinFET having only a single punch-though blocking region 302, which has a conductivity type that is opposite that of the source/drain regions. In this example, the punch-through blocking region has one end under the source and has another end between the gate and drain. The remaining material in the lower portion of fin (region 304) is typically un-doped silicon. Although not illustrated, the punch-through blocking region could be omitted such that the device includes only a drain extension region.

Figure 4:
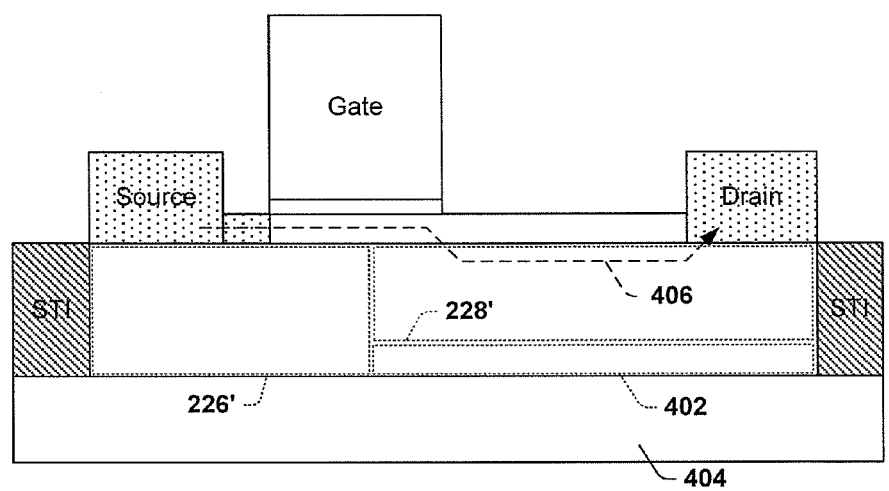
FIG. 4 shows a cross-sectional view of a FinFET with an isolation region beneath a punch-through blocking region between the channel region and drain.

FIG. 4 shows an example where an isolation region 402 is arranged under drain extension region 228'. To isolate the drain extension region 228' from the substrate 404, isolation region 402 often has a second doping type opposite that of the source/drain regions. Current can flow from the source region to the drain region through the drain extension region, as shown by arrow 406.

Figure 5:
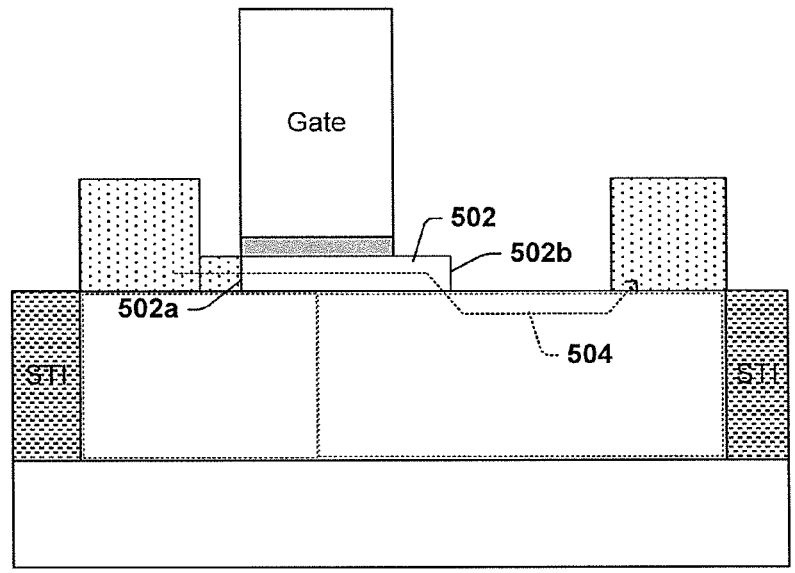
FIG. 5 shows a cross-sectional view of a FinFET with a gap between an intrinsic silicon region of the fin and a drain region.

FIG. 5 shows another example wherein the intrinsic or lightly doped fin 502 does not extend completely between the channel region and drain region. Thus, the intrinsic or lightly doped fin has one end 502a that abuts the source extension region and has another end 502b that stops part way between the gate and the drain. In this implementation, current can pass from the source, through the channel (depending on bias applied), and then passes into the drain extension region before entering the drain—as shown by arrow 504.

Figure 6:
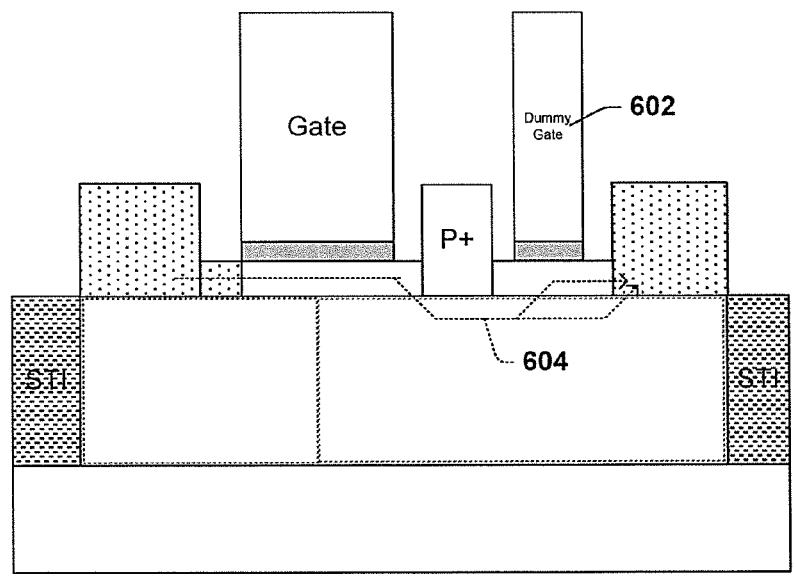
FIG. 6 shows a cross-sectional view of a FinFET that uses a dummy gate.

FIG. 6 shows another example with a dummy gate or field plate 602. An isolation region (p+) is arranged between the dummy gate 602 and the gate electrode. The isolation region is arranged to divide the intrinsic fin into a first part under the gate electrode and a second part under the dummy gate. The dummy gate 602 and isolation region help to ensure ease of manufacturing in many regards, and the dummy gate is often unbiased. Again, current passes into the drain extension region before entering the drain—as shown by arrow 604.

Figure 7A:
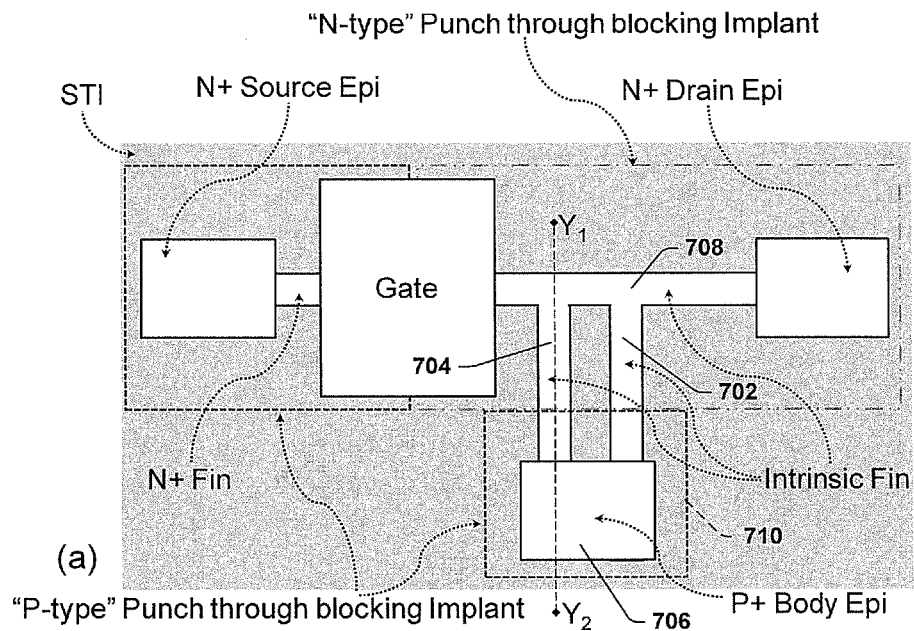
FIG. 7A and FIG. 7B show a top view and cross-sectional view, respectively, of a FinFET having a lateral fin that traverses a longitudinal fin of the FinFET to establish a body contact.
Figure 7B:
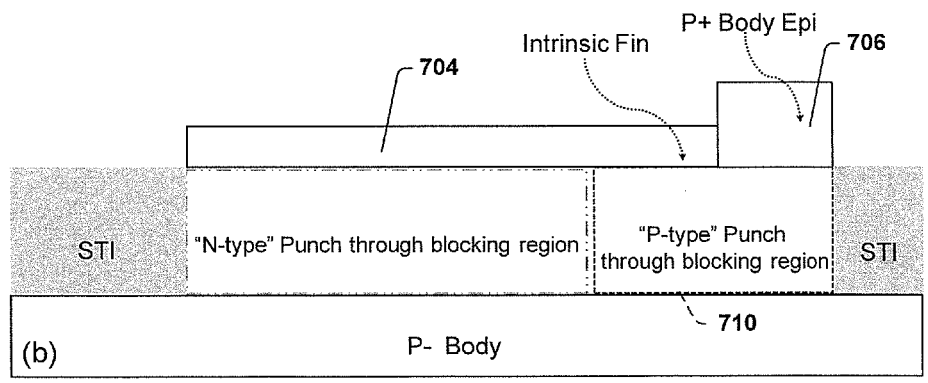

FIGS. 7A-7B show an example of a body contact for a FinFET. In these figures, one or more transverse fins 702/704 extend between a body contact region 706 and the intrinsic fin 708. The transverse fins are often intrinsic silicon, but can also be lightly doped. As shown in FIG. 7B, similar to the longitudinal fin, punch-through blocking regions 710 can be located in a lower portion of the transverse fins.

FIGS. 8-17 show a series of cross-sectional views that illustrate a method of manufacturing an n-type FinFET. A p-type FinFET could also be manufactured in a similar manner by changing the doping types for the various layers. For each figure (e.g., FIG. 8), one view (e.g., FIG. 8B) shows a longitudinal cross-sectional view, and the other views (e.g., FIGS. 8A, 8C) illustrate respective end views. Although these cross-sectional views show various structural features throughout the manufacturing method, it will be appreciated that there are many variations that can be used and this methodology is merely an example.

The method starts in FIG. 8 when a semiconductor fin 802 has been formed over a semiconductor substrate 804. An STI region 806 laterally surrounds a lower portion of the fin, while an upper portion of the fin remains above the STI region. A nitride mask 808 (or other hardmask) is formed over the fin. It will be appreciated that "semiconductor substrate" as referred to herein may comprise any type of semiconductor material including a bulk silicon wafer, a binary compound substrate (e.g., GaAs wafer), a ternary compound substrate (e.g., AlGaAs), or higher order compound wafers, among others. Further, the semiconductor substrate 804 can also include non semiconductor materials such as oxide in silicon-on-insulator (SOI), partial SOI substrate, polysilicon, amorphous silicon, or organic materials, among others. In some instances, the semiconductor substrate 804 can also include multiple wafers or dies which are stacked or otherwise adhered together. The semiconductor substrate 206 can include wafers which are cut from a silicon ingot, and/or any other type of semiconductor/non-semiconductor and/or deposited or grown (e.g. epitaxial) layers formed on an underlying substrate.

In FIG. 9, a first hardmask 902 (e.g., a spacer nitride, photoresist, or other hardmask) is formed and patterned to cover a portion of the fin. While the patterned first hardmask 902 is in place, a p-type punch-through implant 904 is carried out. In this implantation process, the ions are often directed perpendicularly towards the substrate. The first hardmask 902 blocks some ions from entering the fin, while other ions scatter off the STI region to be implanted into the fin under the upper surface of the STI region to form first punch-through blocking region 906.

Figures 10A, 10B, 10C:
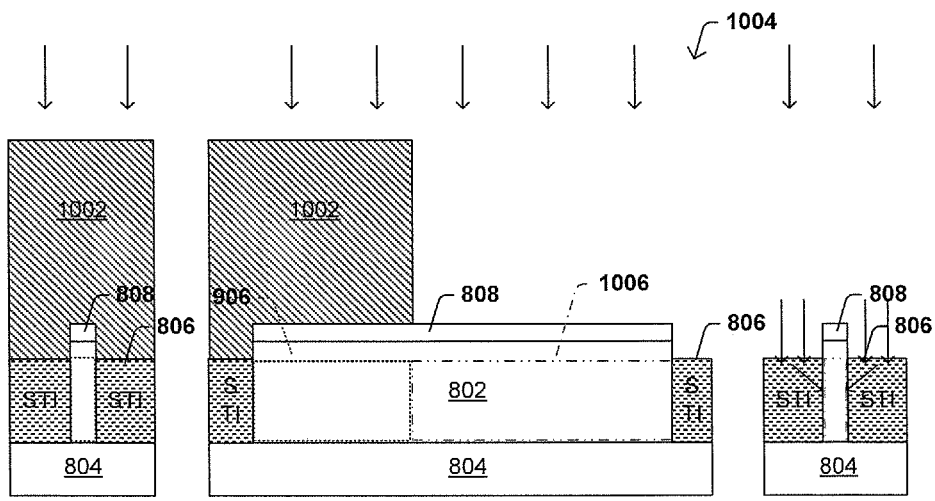
Figures 11A, 11B, 11C:
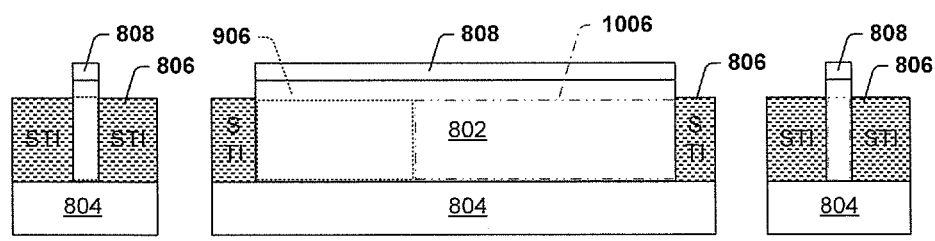

In FIG. 10, the first hard mask 902 is removed, and a second hardmask 1002 is formed and patterned. While the second hardmask 1002 is in place, an n-type drain extension implant 1004 is carried out. This n-type drain extension implant may also be referred to as an n-type punch-through implant, as it can concurrently be implanted into punch-through blocking regions of p-type low-voltage FinFETs (not shown) on semiconductor substrate 804. Again, the ions are often directed perpendicularly towards the substrate. The second hardmask 1002 blocks some ions from entering the fin, while other ions scatter off the STI region to be implanted into the fin under the upper surface of the STI region to form a second punch-through blocking region 1006. FIG. 11 shows the resultant structure after the second hardmask 1002 has been removed.

In FIG. 12, the nitride mask is removed, and in FIG. 13 a gate dielectric 1300 is formed and patterned over the fin. The gate dielectric 1300 can be made out of a high-k dielectric (high-k being relative to k of silicon dioxide, which could also be used for the gate dielectric 220). Illustrative high-k materials include hafnium silicate, zirconium silicate, hafnium dioxide and zirconium dioxide, and are typically deposited using atomic layer deposition.

In FIG. 14, a conductive gate electrode layer is formed over the structure, and is then patterned to form a gate electrode 1400. The gate electrode can be a metal gate electrode or a polysilicon gate electrode.

In FIG. 15, a third hard mask 1500 (e.g., nitride mask, photoresist, or other hardmask) is patterned. While the third hard mask 1500 is in place, ions are implanted to form an n-type source region 1502 and an n-type drain region 1504. In FIG. 16, the third hard mask is removed.

In FIG. 17, n-type source and drain regions 1702, 1704 are optionally grown using epitaxial growth. After this epitaxial growth, contacts and higher layer interconnects can be formed (not shown), which operably couple devices to each other and ultimately to external circuits.

Thus, it will be appreciated that some aspects of the present disclosure relate to a fin field effect transistor (FinFET) disposed on a semiconductor substrate, comprising: a semiconductor fin disposed over the semiconductor substrate and extending between a source region and a drain region. A shallow trench isolation (STI) region that laterally surrounds a lower portion of the semiconductor fin, wherein the lower portion of the semiconductor fin lies beneath an upper surface of the STI region and an upper portion of the semiconductor fin remains above the upper surface of the STI region. A conductive gate electrode that traverses over the semiconductor fin to define a channel region in the semiconductor fin under the conductive gate electrode. A first punch-through blocking region aligned between the drain region and the channel region in the lower portion of the semiconductor fin.

Another aspect relates to a FinFET disposed on a semiconductor substrate. The FinFET comprises a semiconductor fin which is disposed over the semiconductor substrate and which extends between a source region and a drain region. The source and drain regions have a first conductive type. A shallow trench isolation (STI) region laterally surrounds a lower portion of the semiconductor fin, and an upper portion of the semiconductor fin remains above the upper surface of the STI region. A conductive gate electrode traverses over the semiconductor fin to define a channel region in the upper portion of the semiconductor fin under the conductive gate electrode. A first punch-through blocking region is aligned between the source region and the channel region in the lower portion of the semiconductor fin. The first punch-through blocking region has the second conductivity type.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. Further, although the terms "first", "second" "third" and the like are used in this specification, it will be appreciated that such terms are merely generic identifiers and do not imply any spatial or temporal relationship between the various features. Also, although terms such as "upper", "lower", "above", and "below" are used herein, it is to be appreciated that no absolute reference frame (e.g., the ground beneath one's feet) is implied with respect to these and other similar terms. Rather, any coordinate frame can be selected for such terms. In addition, while a particular aspect may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A semiconductor device disposed on a semiconductor substrate, comprising:
    a shallow trench isolation (STI) region disposed over the semiconductor substrate;
    a semiconductor fin disposed within the STI region, the semiconductor fin extending between a source region and a drain region and comprising a first portion and a second portion defined by a surface of the STI region;
    a gate electrode that traverses over the semiconductor fin to define a channel region in the semiconductor fin under the gate electrode;
    a first punch-through blocking region disposed under the source region and extending under the channel region in the second portion of the semiconductor fin; and
    a drain extension region disposed between the gate electrode and the drain region in the second portion of the semiconductor fin.

2. The device of claim 1, wherein the first punch-through blocking region and drain extension region meet at a junction region under the gate electrode.

3. The device of claim 1, further comprising:
    an intrinsic or lightly doped semiconductor region disposed in the first portion of the semiconductor fin between the source and drain regions.

4. The device of claim 3, wherein the intrinsic or lightly doped semiconductor region has a first end and a second end, wherein the first end terminates under the gate electrode and the second end connects to the drain region.

5. The device of claim 3, wherein the intrinsic or lightly doped silicon region has a first end and a second end, wherein the first end terminates under the gate electrode and the second end terminates over the drain extension region so as to be spaced apart from the drain region.

6. The device of claim 5, wherein a distance between the second end and the gate electrode is larger than a length of the channel region under the gate electrode.

7. The device of claim 3, further comprising: a gate oxide separating the gate electrode and the intrinsic or lightly doped region.

8. The device of claim 3, further comprising:
    a dummy gate formed over both the drain extension region and the intrinsic or lightly doped silicon region, the dummy gate being arranged between the gate electrode and the drain region.

9. The device of claim 8, further comprising:
    an isolation region between the dummy gate and the gate electrode, wherein the isolation region is arranged to divide the intrinsic or lightly doped region into a first part under the gate electrode and a second part under the dummy gate.

10. The device of claim 1, wherein a second punch-through blocking implant is used to form the drain extension region of the device concurrently with a second punch-through blocking region in a low-voltage transistor on the semiconductor substrate.

11. The device of claim 1, wherein the source region, the drain region, and the drain extension region have a first conductivity type; and wherein the first punch-through blocking region has a second conductivity type opposite the first conductivity type.

12. The device of claim 1, wherein the source region, the drain region, and the drain extension region are n-type; and wherein the first punch-through blocking region is p-type.

13. The device of claim 1, wherein the source region, the drain region and the drain extension region are p-type; and wherein the first punch-through blocking region is n-type.

14. The device of claim 13, further comprising: an n-type isolation region separating the drain extension region from the substrate.

15. The device of claim 1, further comprising:
    a lateral fin traversing the semiconductor fin and being coupled to a body contact.

16. The device of claim 15, further comprising a second punch-through blocking region under at least a portion of the lateral fin.

17. The device of claim 16, wherein the second punch-through blocking region has a same conductivity type as the first punch-through blocking region.

18. The device of claim 1, wherein the first region is an upper region of the semiconductor fin and the second region is a lower region of the semiconductor fin.

19. A circuit disposed on a semiconductor substrate, comprising:
    a semiconductor fin disposed over the semiconductor substrate and extending laterally between a source region and a drain region;
    a shallow trench isolation (STI) region that laterally surrounds a lower portion of the semiconductor fin, wherein an upper portion of the semiconductor fin remains above an upper surface of the STI region;
    a gate electrode that traverses over the semiconductor fin to define a channel region in the semiconductor fin under the gate electrode;
    an intrinsic or lightly doped semiconductor region in the upper portion of the semiconductor fin between the gate electrode and the drain region;
    a punch-through blocking region in the lower portion of the semiconductor fin between the source region and the channel region; and
    a drain extension region in the lower portion of the semiconductor fin between the channel region and the drain region.

* * * * *